United States Patent
Kamata et al.

[11] Patent Number: 6,165,686
[45] Date of Patent: Dec. 26, 2000

[54] PHOTOCURABLE COMPOSITION AND COLOR REVERSION PREVENTING METHOD

[75] Inventors: Hirotoshi Kamata; Toshio Koshikawa; Takeo Watanabe; Shuichi Sugita, all of Chiba, Japan

[73] Assignee: Showa Denko K.K., Tokyo, Japan

[21] Appl. No.: 09/081,995

[22] Filed: May 21, 1998

Related U.S. Application Data

[60] Provisional application No. 60/074,307, Feb. 11, 1998.

[30] Foreign Application Priority Data

May 22, 1997 [JP] Japan .................................. 9-132576

[51] Int. Cl.[7] ...................................................... G03C 1/73
[52] U.S. Cl. ......................... 430/281.1; 430/916; 522/81
[58] Field of Search ................................ 430/281.1, 916; 522/81

[56] References Cited

U.S. PATENT DOCUMENTS

| 4,937,161 | 6/1990 | Kita et al. ................................. 430/281 |
| 4,971,891 | 11/1990 | Kawamura et al. ..................... 430/278 |
| 5,055,372 | 10/1991 | Shanklin et al. ......................... 430/138 |
| 5,124,236 | 6/1992 | Yamaguchi et al. ..................... 430/281 |
| 5,168,032 | 12/1992 | Okamoto et al. ........................ 430/281 |
| 5,176,984 | 1/1993 | Hipps, Sr. et al. ...................... 430/281 |

FOREIGN PATENT DOCUMENTS

| 0434437 | 6/1991 | European Pat. Off. .......... G03F 7/00 |
| 197 30 498 A1 | 1/1998 | Germany ........................... C08F 2/48 |
| 4-80204 | 4/1992 | Japan . |
| 4-230756 | 8/1992 | Japan . |
| 5-59110 | 3/1993 | Japan . |
| 10-81838 | 3/1998 | Japan . |

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

Color reversion of photocured products which have been photocured with cationic dyes and quaternary organo borates can be notably suppressed by addition of phenolic compounds, aromatic thiol compounds, amine compounds and/or phosphorous compounds.

8 Claims, No Drawings

PHOTOCURABLE COMPOSITION AND COLOR REVERSION PREVENTING METHOD

CROSS REFERENCE TO RELATED APPLICATIONS

This application is an application filed under 35 U.S.C. §111(a) claiming benefit pursuant to 35 U.S.C. §119(e)(1) of the filing date of the Provisional Application 60/074,307, filed Feb. 11, 1998, pursuant to 35 U.S.C. §111(b).

BACKGROUND OF THE INVENTION

1. Field of the Invention

The present invention relates to compositions that suppress after curing color reversion of photocuring materials which sufficiently cure to the interior of the compositions, even when the compositions contain pigments and coloring dyes with high masking ability, or have a high thickness or contain poor light transmitting materials, as well as to a color reversion-preventing method.

2. Description of the Related Art

Photopolymerization has been conventionally employed for a wide range of multifaceted uses, including curing of coatings, printing resin relief-printing, printed board construction, resist and photo masking, black-and-white and color transfer coloring sheets and coloring sheet preparation, etc., and the recent focus on environmental issues, energy conservation and labor-saving means to counter increasing labor costs has stimulated active development with an emphasis on polymerization at normal temperature, rapid drying and the ability to be used without a solvent, which are features of photopolymerization. Photocuring which is carried out by cationic polymerization or radical polymerization by irradiation with ultraviolet light of 200–400 nm generally allows rapid curing of polymerizable monomers and oligomers. However, the poor penetration of ultraviolet light has been a problem with colored coatings containing pigments or dyes with strong masking powers, and photocuring has therefore been associated with the disadvantage of a very poor curability of coating interiors. In order to overcome this problem there have been proposed, in Japanese Unexamined Patent Publication No. 4-80204, No. 5-59110 and No. 10-81838, photopolymerization initiators made from cationic dyes, with absorption in the visible light range, and quaternary organo borates. These photopolymerization initiators initiate radical polymerization upon irradiation with light, and allow sufficient curing to the coating interiors even when high-masking pigments are present. Nevertheless, although the color of the cationic dye first disappears completely during the photopolymerization, the color reappears after continued use, thus disadvantageously impairing the color of the cured product. For this reason, these initiators are totally unusable for applications in which the colors of cured products, such as paints and inks, are important.

SUMMARY OF THE INVENTION

It is an object of the present invention to provide a composition capable of suppressing color reversion of cured products which have been photocured using cationic dyes and quaternary organo borates.

In order to solve the problems mentioned above, the present inventors have diligently studied methods of preventing color reversion of photocuring materials comprising cationic dyes represented by general formula (1), quaternary organo borates represented by general formula (2) and compounds with ethylenic unsaturated groups, and as a result we have completed the present invention upon the finding that the color reversion of cured products can be notably suppressed by addition of phenolic compounds, aromatic thiol compounds, amine compounds and/or phosphorous compounds.

$$D^+ \cdot A^- \tag{1}$$

where $D^+$ is a cationic dye with maximum absorption in the visible light range of 400–740 nm, and $A^-$ represents any desired anion.

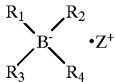

(2)

where $R_1$, $R_2$, $R_3$ and $R_4$ each independently represent an alkyl group, an aryl group, an aralkyl group, an alkenyl group, an alkynyl group, a silyl group, a heterocyclic group or a halogen atom; and $Z^+$ represents a quaternary ammonium cation, quaternary pyridinium cation, quaternary quinolinium cation, phosphonium cation, sulfonium cation, oxosulfonium cation, iodonium cation or metal cation.

DESCRIPTION OF THE PREFERRED EMBODIMENTS

When a cationic dye of general formula (1) and a quaternary organo borate of general formula (2) according to the construction of the invention are irradiated with light in a compound containing an ethylenic unsaturated bond, the cationic dye is first excited. Concurrently with the consequent electron transfer from the quaternary organo borate to the excited cationic dye, the quaternary organo borate is decomposed generating an active radical which initiates polymerization. The cationic dye is meanwhile converted to a dye radical by the electron transfer from the quaternary organo borate, but then binds to the active radical, causing the color to disappear. However, the color of the cationic dye reappears in the photocured product obtained by polymerization with the cationic dye and quaternary organo borate, for reasons still unknown. However, addition of certain phenolic compounds, aromatic thiol compounds, amine compounds and/or phosphorous compounds completely prevent reappearance of the cationic dye color without inhibiting the polymerization reaction.

Photocurable compositions prepared by combining hindered phenols, hindered amines and phosphite salts with compositions comprising cationic dye-organo borate complexes and radical polymerizing compounds are disclosed in Japanese Unexamined Patent Publication No. 4-230756, but their effect is limited to an improvement in storage stability. Also, because Japanese Unexamined Patent Publication No. 4-230756 employs a cationic dye-organo borate complex, the cationic portion of the dye and the organo borate anion are in a 1:1 molar ratio, which differs from the composition of the present invention wherein the quaternary organo borate is added in substantial excess, and therefore the color of the cationic dye fails to completely disappear during photocuring. Color reversion of the cationic dye was therefore not considered to be a problem in any way. The subject matter of the present invention will now be explained in detail.

Of cationic dyes of general formula (1) having maximum absorption in the visible light range of 400–740 nm, the cation ($D^+$) is preferred to be the cationic portion of, for example, a methine-, polymethine-, xanthene-, azine-, oxazine-, thiazine-, diarylmethane- or triarylmethane-based cationic dye, and specific examples thereof are shown in Table 1, although the invention is in no way limited thereto.

TABLE 1
| Number | Chemical structure | Maximum absorption wavelength (solvent) |
|---|---|---|
| 1 | 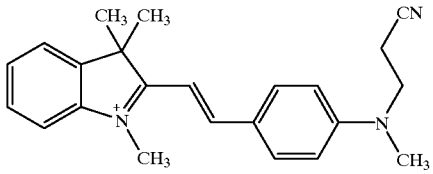 | 522 nm (acetonitrile) |
| 2 | 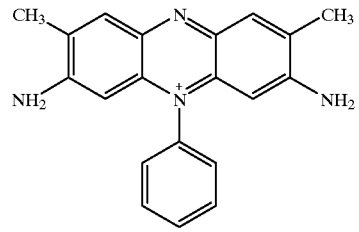 | 528 nm (chloroform) |
| 3 | 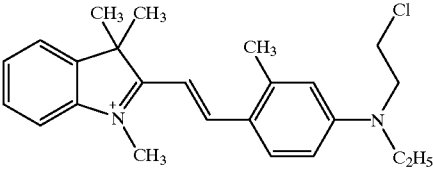 | 544 nm (acetonitrile) |
| 4 | 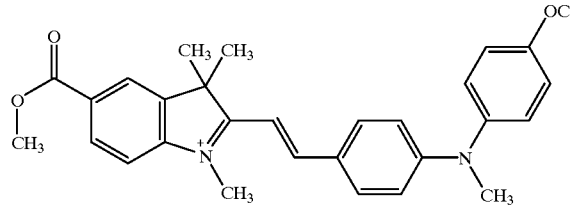 | 559 nm (acetonitrile) |
| 5 | 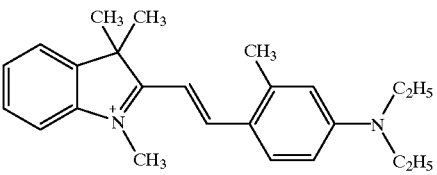 | 560 nm (acetonitrile) |
| 6 | 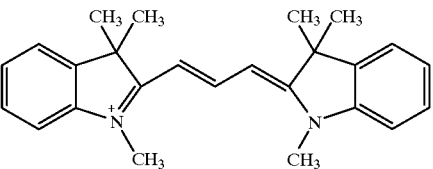 | 543 nm (acetonitrile) |

TABLE 1-continued

| Number | Chemical structure | Maximum absorption wavelength (solvent) |
|---|---|---|
| 7 | | 584 nm (acetonitrile) |
| 8 | | 589 nm (acetonitrile) |
| 9 | | 613 nm (acetonitrile) |
| 10 | | 632 nm (acetonitrile) |

TABLE 1-continued

| Number | Chemical structure | Maximum absorption wavelength (solvent) |
|---|---|---|
| 11 | | 658 nm (chloroform) |
| 12 | | 641 nm 816 nm (acetonitrile) |

The counter anion (A⁻) of the cationic dye of general formula (1) may be any desired anion, for example, a halogen anion such as Cl⁻, Br⁻ or I⁻, a sulfonate anion such as benzenesulfonate anion, p-toluenesulfonate anion, methanesulfonate anion, 1-naphthalenesulfonate anion or 2-naphthanesulfonate anion, a borate anion such as tetraphenyl borate, tetraanisyl borate, n-butyltriphenyl borate, n-butyltri(4-tert-butylphenyl)borate, n-butyltri(4-fluoro-2-methylphenyl)borate, tetrabenzyl borate or tetrafluoroborate, or other anions such as $ClO_4^-$, $AsF_6^-$, $PF_6^-$, $SbF_6^-$, etc. However, the invention is in no way limited to these examples. Two or more of these cationic dyes may be used in any desired proportion as necessary.

The alkyl, aryl, aralkyl, alkenyl, alkynyl, silyl and heterocyclic groups for $R_1$, $R_2$, $R_3$ and $R_4$ in the general formula (2) may optionally have one or more substituents. As concrete examples of the substituents, there may be mentioned alkyl groups such as methyl, ethyl, n-propyl, isopropyl, n-butyl, sec-butyl, isobutyl, tert-butyl, n-octyl and n-dodecyl, alicyclic hydrocarbon groups such as cyclopentyl and cyclohexyl, aromatic hydrocarbon groups such as phenyl, tolyl, xylyl, biphenylyl, naphthyl, benzyl, phenethyl and diphenylmethyl, alkoxy groups such as methoxy, ethoxy, n-propoxy, isopropoxy, n-butoxy, sec-butoxy and tert-butoxy, aryloxy groups such as phenoxy, heterocyclic groups such as 2-furyl and 2-pyridyl, and halogen atoms such as chlorine, bromine and fluorine.

As concrete examples of the anion portion of the quaternary organo borate represented by general formula (2), to be used according to the invention, there may be mentioned n-butyltriphenyl borate, n-octyltriphenyl borate, n-dodecyltriphenyl borate, sec-butyltriphenyl borate, tert-butyltriphenyl borate, benzyltriphenyl borate, n-butyltrianisyl borate, n-octyltrianisyl borate, n-dodecyltrianisyl borate, n-butyltri(4-tolyl)borate, n-butyltri(2-tolyl)borate, n-butyltri(4-tert-butylphenyl) borate, n-butyltri(4-fluoro-2-methylphenyl)borate, n-butyltri(4-fluorophenyl)borate, n-butyltrinaphthyl borate, triphenylsilyltriphenyl borate, diphenylmethylsilyltriphenyl borate, dimethylphenylsilyltriphenyl borate, trimethylsilyltriphenyl borate, tetra-n-butyl borate, di-n-butyldiphenyl borate and tetrabenzyl borate. As concrete examples of the cation portion there may be mentioned tetramethylammonium, tetraethylammonium, tetra-n-butylammonium, tetraoctylammonium, methylquinolinium, ethylquinolinium, methylpyridinium, ethylpyridinium, tetramethylphosphonium, tetra-n-butylphosphonium, trimethylsulfonium, trimethylsulfoxonium, diphenyliodonium, lithium, sodium, etc. These anion portions and cation portions may be used for the invention in any desired combination. Also, the present invention is not limited to these examples, and there is no problem with using 2 or more quaternary organo borates in combination.

The compound with an ethylenic unsaturated bond to be used for the invention may be any compound with at least one ethylenic unsaturated bond in the molecule capable of radical polymerization, and may have the chemical form of a monomer, oligomer or polymer. Any one of these may be used alone, or a system with two or more in combination in any desired proportion may be used to improve the targeted characteristics. The following are examples of compounds with ethylenic unsaturated bonds capable of radical polymerization.

As polymerizable monomers there may be mentioned esters of (meth)acrylic acid and monohydric alcohols, such as methyl (meth)acrylate, ethyl (meth)acrylate, n-butyl (meth)acrylate, isobutyl (meth)acrylate, tert-butyl (meth) acrylate, propyl (meth)acrylate, hexyl (meth)acrylate, octyl (meth)acrylate, lauryl (meth)acrylate, 2-ethylhexyl (meth) acrylate, cyclohexyl (meth)acrylate, stearyl (meth)acrylate, isobornyl (meth)acrylate, dicyclopentanyl (meth)acrylate, dicyclopentenyl (meth)acrylate, benzyl (meth)acrylate, butoxyethyl (meth)acrylate and phenoxyethyl (meth) acrylate.

Other monomers which may be used include vinylbenzenes such as styrene, vinylstyrene, methylstyrene, chlorostyrene and divinylbenzene; vinyl ethers such as isobutylvinyl ether, methylvinyl ether and 2-ethylhexylvinyl ether; (meth)acrylic compounds such as (meth)acrylamide and methylene-bis(meth)acrylamide; vinyl esters such as vinyl acetate, vinyl propionate and vinyl benzoate; allyl-containing monomers such as allyl alcohol, allyl acetate, diallyl phthalates and triallyl trimellitate; and other vinyl compounds.

Other monomers which may be used include carboxyl-containing monomers such as (meth)acrylic acid; hydroxyl-containing monomers such as 2-hydroxyethyl (meth)acrylate and 2-hydroxypropyl (meth)acrylate; addition products of isocyanate compounds such as butyl isocyanate and phenyl isocyanate and the above-mentioned hydroxyl-containing monomers; and nitrogenous unsaturated monomers such as N-vinylpyrrolidone, N-vinylcarbazole, N-vinylacetamide and vinylpyridines.

Such monomers further include polyfunctional vinyl compounds such as diethylene glycol di(meth)acrylate, triethylene glycol di(meth)acrylate, polyethylene glycol di(meth)acrylate, propylene glycol di(meth)acrylate, 1,3-butanediol di(meth)acrylate, 1,4-butanediol di(meth)acrylate, neopentyl glycol di(meth)acrylate, 1,6-hexanediol di(meth)acrylate, trimethylolpropane tri(meth)acrylate, pentaerythritol tri(meth)acrylate, pentaerythritol tetra(meth)acrylate and dipentaerythritol hexa(meth)acrylate, products of reacting (meth)acrylic acid with addition products of polyhydric alcohols and ethylene oxide or propylene oxide, products of reacting (meth)acrylic acid with addition products of polyhydric alcohols and ε-caprolactone, phosphorous-containing polymerizable monomers, (meth)acrylic functional polyorganosilsesquioxane, etc.

Polymerizable oligomers include ethylenic unsaturated group-containing resins, specific examples of which are polyester (meth)acrylate, unsaturated polyester resins, urethane (meth)acrylate, epoxy (meth)acrylate, polybutadiene (meth)acrylate, silicone (meth)acrylate and (meth)acryloyl group-containing acryl resins.

The phenolic compound to be used according to the invention is suitably a compound with a substituent in at least one of the ortho positions of the carbon atom bound to the phenolic hydroxyl group. Concrete examples of such phenolic compounds include 2,4,6-tri-tert-butylphenol, 2,6-di-tert-butyl-p-cresol, N,N-hexamethylene bis(3-5-di-butyl-4-hydroxy-hydrocinnamide), 4-tert-butylcatechol, octadecyl-3-(3,5-di-tert-butyl-4-hydroxyphenyl)propionate, 3,5-di-tert-butyl-4-hydroxy-benzylphosphonate diethyl ester, 1,3,5-trimethyl-2,4,6-tris(3,5-di-tert-butyl-4-hydroxybenzyl)benzene, tris-(3,5-di-tert-butyl-hydroxybenzyl)isocyanurate, 2,4-bis[(octylthio)methyl]-o-cresol, 2,2'-methylenebis(4-methyl-6-tert-butylphenol), 4,4'-thiobis(3-methyl-6-tert-butylphenol), 2,4,6-tris(dimethylaminomethyl)phenol, isooctyl-3-(3,5-di-tert-butyl-4-hydroxyphenyl)propionate, 2-(3,5-di-tert-butyl-2-hydroxyphenyl)-5-chlorobenzotriazole, 2-(3,5-di-tert-amyl-2-hydroxyphenyl)benzotriazole, 2-(3,5-di-tert-butyl-2-hydroxyphenyl)benzotriazole, 2,4-di-tert-butylphenyl-3,5-di-tert-butyl-4-hydroxybenzoate, p-tert-butylphenyl salicylate, p-octylphenyl salicylate, 2-hydroxy-4-octoxybenzophenone and 2-hydroxy-4-dodecyloxybenzophenone. More specifically, the compounds listed in "12695 Chemical Products" (Chemical Daily Co., Ltd., 1995), pp.969–973, pp.977–981, the compounds listed in "Development and Latest Technologies for Polymer Additive" (1992, CMC Publishing), pp.37–56, and the phenolic compounds listed in "Polyfile" (Taiseisha Limited), 1997, Vol.3, pp.22–30, may be used.

Concrete examples of aromatic thiol compounds to be used for the invention include thiophenol, 2-mercaptobenzothiazole, 2-mercaptobenzooxazole, 2-mercaptobenzoimidazole, 2-mercaptomethylbenzimidazole, 2,4,6-trimercapto-s-triazine and 2-mercaptoimidazoline.

Examples of amine compounds to be used for the invention include aliphatic amines such as triethanolamine, tributylamine, 2,4,6-tris(N,N-dimethylaminomethyl)phenol and N,N-dimethylbenzylamine, and aromatic amines such as N,N-dimethylaniline and N,N-dimethyl-p-toluidine, but hindered amine compounds having a structural unit represented by general formula (3) are preferred.

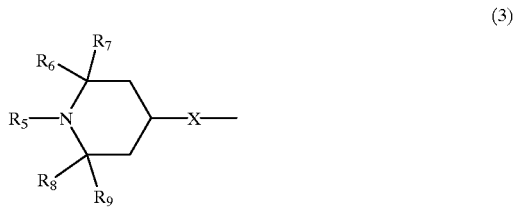

(3)

where $R_5$ represents a hydrogen atom, an alkyl group, an alkoxy group or an alkylcarbonyl group; $R_6$, $R_7$, $R_8$ and $R_9$ each independently represent an alkyl group; and X represents a carbon atom, oxygen atom, nitrogen atom or sulfur atom.

The alkyl, alkoxy and alkylcarbonyl groups for $R_5$, $R_6$, $R_7$, $R_8$ and $R_9$ in the general formula (3) may optionally have one or more substituents. As concrete examples of the substituents, there may be mentioned alkyl groups such as methyl, ethyl, n-propyl, isopropyl, n-butyl, sec-butyl, isobutyl, tert-butyl, n-octyl and n-dodecyl, alicyclic hydrocarbon groups such as cyclopentyl and cyclohexyl, aromatic hydrocarbon groups such as phenyl, tolyl, xylyl, biphenylyl, naphthyl, benzyl, phenethyl and diphenylmethyl, alkoxy groups such as methoxy, ethoxy, n-propoxy, isopropoxy, n-butoxy, sec-butoxy and tert-butoxy, aryloxy groups such as phenoxy, heterocyclic groups such as 2-furyl and 2-pyridyl, and halogen atoms such as chlorine, bromine and fluorine.

Concrete examples of such compounds include bis(2,2,6,6-tetramethyl-4-piperidyl)sebacate, bis(1,2,2,6,6-pentamethyl-4-piperidyl)sebacate, 2-(3,5-di-tert-butyl-4-hydroxybenzyl)-2-n-butylmalonic bis(1,2,2,6,6-pentamethyl-4-piperidyl), 4-benzoyloxy-2,2,6,6-tetramethylpiperidine, and 8-acetyl-3-dodecyl-7,7,9,9-tetramethyl-1,3,8-trisazaspiro[4,5]decane-2,4-dione. More specifically, there may be mentioned the compounds listed in "12695 Chemical Products" (Chemical Daily Co., Ltd., 1995), pp.982–984.

As phosphorous compounds to be used for the invention, compounds having the structure represented by general formula (4) are particularly effective at preventing color reversion of photocured products.

(4)

where $R_{10}$, $R_{11}$ and $R_{12}$ each independently represent an alkyl group, an alkoxy group, an aryl group, or an aryloxy group.

The alkyl, alkoxy, aryl and aryloxy groups for $R_{10}$, $R_{11}$ and $R_{12}$ in the general formula (4) may optionally have one or more substituents. As concrete examples of the substituents, there may be mentioned alkyl groups such as methyl, ethyl, n-propyl, isopropyl, n-butyl, sec-butyl, isobutyl, tert-butyl, n-octyl and n-dodecyl, alicyclic hydrocarbon groups such as cyclopentyl and cyclohexyl, aromatic hydrocarbon groups such as phenyl, tolyl, xylyl, biphenylyl, naphthyl, benzyl, phenethyl and diphenylmethyl, alkoxy groups such as methoxy, ethoxy, n-propoxy, isopropoxy, n-butoxy, sec-butoxy and tert-butoxy, aryloxy groups such as phenoxy, heterocyclic groups such as 2-furyl and 2-pyridyl, and halogen atoms such as chlorine, bromine and fluorine.

Concrete examples of phosphorous compounds include triphenylphosphine, tricyclohexylphosphine, trimethyl phosphite, triethyl phosphite, tributyl phosphite, triphenyl phosphite, tris(2,4-di-tert-butylphenyl)phosphite, tris(nonylphenyl)phosphite, diphenylisodecyl phosphite, phenyldiisodecyl phosphite, cyclic neopentane tetraylbis(octadecyl phosphite), 2,2-methylenebis(4,6-di-tert-butylphenyl)octyl phosphite and 10-decyloxy-9,10-dihydro-9-oxa-10-phosphaphenanthrene, and more specifically there may be mentioned the compounds listed "Development and Latest Technologies for Polymer Additive" (1992, CMC Publishing), pp.60–66.

The compound used according to the invention to prevent color reversion is used by adding it directly to the photocuring material comprising 100 parts by weight of the compound with the ethylenic unsaturated bond, 0.001–5 part by weight of the cationic dye with maximum absorption in the visible light range of 400–740 nm and 0.005–10 parts by weight of the quaternary organo borate, and its effect is exhibited after photocuring. The amount of the color reversion-preventing compound added is 0.05–15 parts by weight to 100 parts by weight of the compound with the ethylenic unsaturated bond. If it is added at greater than 15 parts by weight, the properties of the cured product will be inferior. Also, at less than 0.05 part by weight, no notable effect of color reversion prevention is achieved. The preferred amount is from 0.2 to 10 parts by weight. Color reversion-preventing compounds selected from among phenolic compounds, aromatic thiol compounds, amine compounds and phosphorous compounds may be used either alone or in any combination of two or more.

According to the invention, a sufficient function of preventing color reversion may be exhibited even with the addition of an ultraviolet radical polymerization initiator, a polymerization accelerator to improve the curability to the interior of the composition, a coloring material, an extender pigment, an organic high-molecular polymer, a solvent, etc.

The ultraviolet radical polymerization initiator is a compound which generates a radical under irradiation with ultraviolet light of 400 nm or below, and it is added for the purpose of increasing the curability of the composition surface in air. Concrete examples of ultraviolet radical polymerization initiators include benzoin ether compounds such as benzoin isobutyl ether, benzoin isopropyl ether, benzoin ethyl ether and benzyl dimethyl ketal; acetophenone compounds such as 2-hydroxy-2-methyl-1-phenylpropane-1-one, 1-(4-isopropylphenyl)-2-hydroxy-2-methylpropan-1-one, 1-hydroxycyclohexyl phenyl ketone, 2-methyl-1-[4-(methylthio)phenyl]-2-morpholinopropanone-1,2-benzyl-2-dimethylamino-1-(4-morpholinophenyl)-butanone-1 and 4-tert-butyltrichloroacetophenone; glyoxy ester compounds such as methylphenyl glyoxylate; acylphosphine oxide compounds such as 2,4,6-trimethylbenzoyldiphenylphosphine oxide and bis(2,6-dimethoxybenzoyl)-2,4,4-trimethylpentylphosphine oxide; benzophenone compounds such as benzophenone, benzoyl benzoate and 4-phenylbenzophenone; and thioxanthone compounds such as 2,4-diethylthioxanthone, 2,4-diisopropylthioxanthone and isopropylthioxanthone.

Generally, compounds known as P1-type photoinitiators, such as benzoin ether compounds, acetophenone compounds, glyoxy ester compounds and acylphosphine oxide compounds may be used alone, and P2-type photoinitiators such as benzophenone compounds and thioxanthone compounds may be used in combination with hydrogen donors. A hydrogen donating compound is one which can donate hydrogen to an initiator which has been excited by light, and as examples there may be mentioned aliphatic amines such as triethanolamine and methyldiethanolamine, and aromatic amines such as 2-dimethylaminoethylbenzoic acid, ethyl 4-dimethylaminobenzoate, butyl 4-dimethylaminobenzoate and 4,4-dimethylaminobenzophenone. These ultraviolet radical polymerization initiators may be used alone or in combinations of 2 or more. The ultraviolet radical polymerization initiator is added in an amount of 0.01–10 parts by weight to 100 parts by weight of the compound with the ethylenic unsaturated bond. At less than 0.01 parts by weight, curing becomes difficult in air, and at greater than 10 parts by weight the properties of the cured product are inferior and deterioration of the cured product occurs due to residue of the ultraviolet radical polymerization initiator. The amount is preferably in the range of 0.1–5 parts by weight.

Examples of polymerization accelerators for accelerated curing at the interior of the composition include diaryliodonium salt-based compounds, triarylsulfonium salt-based compounds, pyridinium salt-based compounds, peroxide-based compounds, triazine-based compounds with trichloromethyl groups, and halogenated sulfone compounds, of which concrete examples are listed in Japanese Unexamined Patent Publication No. 9-62628.

The coloring pigment used as the coloring material may be any publicly known organic or inorganic pigment described in "Updated Pigment Handbook" (ed. Association of Japan Pigment Technology, 1976), including white pigments such as titanium white and zinc oxide. The coloring dye used may be any publicly known one described in "Dye Handbook" (ed. The Society of Synthetic Organic Chemistry, 1970). Examples include aluminum powder, aluminum paste, silver powder, titanium oxide-coated mica, mica-like iron oxide, etc.

Examples of extender pigments include powders of silica, silica-alumina, alumina, aluminum hydroxide, quartz, glass, calcium carbonate, kaolin, talc, mica, aluminum sulfate and calcium phosphate, as well as these powders which have the particle surfaces coated with a polyfunctional (meth)acrylate monomer or silane coupling agent. As organic high-molecular polymers there may be mentioned polymers and copolymers of polyacrylates, poly-α-alkyl acrylates, polyamides, polyvinyl acetals, polyurethanes, polycarbonates, polystyrenes and polyvinyl esters, and more specific examples include polymethacrylate, polymethyl methacrylate, polyethyl methacrylate, polyvinyl carbazole, polyvinyl pyrrolidone, polyvinyl butyral, polyvinyl acetate, novolac resins, phenol resins, epoxy resins and alkyd resins.

Examples of solvents include common solvents conventionally used for pigments, for example aromatic hydrocarbons such as toluene and xylene, alcohols such as 2-propanol and 1-butanol, ketones such as acetone, methyl ethyl ketone and methyl isobutyl ketone, ethers such as diethyleneglycol dimethyl ether and triethyleneglycol dimethyl ether, esters such as ethyl acetate, butyl acetate and amyl acetate, and monoethers of ethylene glycol such as methyl cellosolve and ethyl cellosolve.

A notable effect of preventing color reversion can also be achieved even with the use of added anti-decolorization agents, fluorescent brighteners, surfactants, plasticizers, flame retardants, ultraviolet absorbers, foaming agents, antifungal agents, antistatic agents, magnetic substances, conductive materials, radical polymerization inhibitors and the like.

The present invention will now be explained by way of the following examples. It is to be understood, of course, that the invention is in no way limited to these examples.

Preparation of Coatings

Titanium oxide-containing coating compositions were prepared with the compositions listed in Table 2.

TABLE 2

Compositions for white paints

| | Type and composition of paint | | |
|---|---|---|---|
| | White paint 1 | White paint 2 | White paint 3 |
| Type and content of compound with ethylenic unsaturated bond (pts by wt) | UV-7550B[*1] 42.0 pts/wt 3EG-A[*2] 14.0 pts/wt isobornyl acrylate 14.0 pts/wt | ARONIX M-8030[*3] 42.0 pts/wt 14EG-A[*4] 28.0 pts/wt | RIPOXY SP-1529X[*5] 49.0 pts/wt dicyclopentanyl acrylate 21.0 pts/wt |
| Type and content of pigment (pts by wt) | CR-90[*6] 30.0 pts/wt | same as left | same as left |

TABLE 2-continued

Compositions for white paints

| | Type and composition of paint | | |
|---|---|---|---|
| | White paint 1 | White paint 2 | White paint 3 |
| Type and content of solvent (pts by wt) | butyl acetate 18.0 pts/wt | same as left | same as left |
| Type and content of additives (pts by wt) | Homogenol L-18[*7] 1.0 pt/wt Polyflow No. 75[*8] 1.0 pt/wt | same as left | same as left |

[*1]: urethane acrylate resin (Nihon Synthetic Chemical Co., Ltd.)
[*2]: triethylene glycol diacrylate (Kyoeisha Chemical Co., Ltd.)
[*3]: polyester acrylate resin (Toagosei Chemical Industry Co., Ltd.)
[*4]: PEG#600 diacrylate (Kyoeisha Chemical Co., Ltd.)
[*5]: epoxy acrylate resin (Showa Highpolymer Co., Ltd.)
[*6]: titanium oxide (Ishihara Sangyo Kaisha, Ltd.)
[*7]: dispersing agent (Kao Corporation)
[*8]: levelling agent (Kyoeisha Chemical Co., Ltd.)

Preparation of Samples and Comparative Samples

Photocuring samples were prepared with the mixing compositions listed in Table 3. The comparative samples were prepared with the same compositions as the photocuring samples, excluding only the color reversion-preventing agent. Thus, comparative sample 1 was sample 1 without the color reversion-preventing agent, comparative sample 2 was sample 2 without the color reversion-preventing agent, and so on.

TABLE 3

Compositions for photocuring samples

| | Type/content of paint | Type/amount of color reversion-preventing agent (parts by weight) | Type/amount of ultraviolet radical polymerization initiator | Type/amount of cationic dye (pts by wt) cation | anion | Type/amount of anion portion of quaternary organo borate (cation portion: tetra-n-butyl-ammonium) (pts by wt) | Type/amount of polymerization accelerator (parts by weight) |
|---|---|---|---|---|---|---|---|
| Sample 1 | white paint 1 100 | 2,4,6-tri-tert-butylphenol 1.0 | Darocur 1173[*8] 2.0 Lucirin TPO[*9] 0.5 | Table 1-3 | chloride anion 0.025 | n-butyltriphenyl borate 0.30 | — |
| Sample 2 | white paint 1 100 | TINUVIN 327[*1] 2.0 | Irgacure 184[*10] 2.0 | Table 1-3 | chloride anion 0.025 | n-butyltri(4-tert-butylphenyl) borate 0.40 | — |
| Sample 3 | white paint 1 100 | 2-mercaptobenzo-thiazole 2.0 | Darocur 1173 2.0 | Table 1-3 | tetraphenyl borate 0.040 | n-butyltri(2-tolyl) borate 0.40 | triphenylsulfonium triflate 0.30 |
| Sample 4 | white paint 1 100 | IRGANOX 1076[*2] 2.0 | Darocur 1173 2.0 | Table 1-4 | tetraphenyl borate 0.045 | n-butyltri(4-tolyl) borate 0.40 | diphenyliodonium triflate 0.30 |
| Sample 5 | white paint 2 100 | TINUVIN 328[*3] 2.0 | Irgacure 1700[*11] 2.5 | Table 1-4 | tetraphenyl borate 0.045 | n-butyltriphenyl borate 0.30 | — |

TABLE 3-continued

Compositions for photocuring samples

| | Type/content of paint | Type/amount of color reversion-preventing agent (parts by weight) | Type/amount of ultraviolet radical polymerization initiator | Type/amount of cationic dye (pts by wt) cation | anion | Type/amount of anion portion of quaternary organo borate (cation portion: tetra-n-butyl-ammonium) (pts by wt) | Type/amount of polymerization accelerator (parts by weight) |
|---|---|---|---|---|---|---|---|
| Sample 6 | white paint 2 100 | TINUVIN 144*[4] 2.0 | Darocur 1173 2.0 Lucirin TPO 0.5 | Table 1-7 | chloride anion 0.025 | n-butyltri(4-fluoro-2-methylphenyl)borate 0.50 | — |
| Sample 7 | white paint 2 100 | 2,4,6-tri-tert-butyl-phenol 1.0 | Irgacure 184 2.5 | Table 1-7 | tetraphenyl borate 0.040 | n-butyltriphenyl borate 0.30 | — |
| Sample 8 | white paint 3 100 | TINUVIN 120*[5] 1.5 | Irgacure 184 2.5 | Table 1-7 | chloride anion 0.025 | n-butyltriphenyl borate 0.30 | — |
| Sample 9 | white paint 3 100 | TINUVIN 327 2.0 | Irgacure 184 2.5 | Table 1-7 | tetraphenyl borate 0.040 | n-butyltri(4-tert-butylphenyl)borate 0.40 | diphenyliodonium triflate 0.30 |
| Sample 10 | white paint 1 100 | IRGANOX 1076 2.0 | Irgacure 1700 2.5 | Table 1-8 | chloride anion 0.025 | n-butyltriphenyl borate 0.30 | — |
| Sample 11 | white paint 1 100 | SANOL LS770*[6] 2.0 | Darocur 1173 2.0 | Table 1-8 | chloride anion 0.025 | n-butyltriphenyl borate 0.30 | — |
| Sample 12 | white paint 1 100 | TINUVIN 292*[7] 2.0 | Darocur 1173 2.0 Lucirin TPO 0.2 | Table 1-8 | chloride anion 0.025 | n-butyltri(4-tert-butylphenyl)borate 0.40 | triphenylsulfonium triflate 0.30 |
| Sample 13 | white paint 1 100 | triphenylphosphine 2.0 | Darocur 1173 2.0 | Table 1-8 | tetraphenyl borate 0.040 | n-butyltri(4-tert-butylphenyl)borate 0.40 | — |
| Sample 14 | white paint 1 100 | triphenyl phosphite 2.0 | Darocur 1173 2.0 | Table 1-8 | tetraphenyl borate 0.040 | n-butyltriphenyl borate 0.30 | — |
| Sample 15 | white paint 1 100 | tributyl phosphite 1.0 | Darocur 1173 2.0 Lucirin TPO 0.5 | Table 1-5 | chloride anion 0.020 | n-butyltrinaphthyl borate 0.35 | — |

*1: 2-(3,5-di-tert-butyl-2-hydroxyphenyl)-5-chlorobenzotriazole (Ciba Specialty Chemicals)
*2: octadecyl-3-(3,5-di-tert-butyl-4-hydroxyphenyl) propionate (Ciba Specialty Chemicals)
*3: 2-(3,5-di-tert-amyl-2-hydroxyphenyl)benzotraizole (Ciba Specialty Chemicals)
*4: bis(1,2,2,6,6-pentamethyl-4-piperidyl) 2-(3,5-di-tert-butyl-4-hydroxybenzyl)-2-n-butylmalonate (Ciba Specialty Chemicals)
*5: 2,4-di-tert-butylphenyl-3,5-di-tert-butyl-4-hydroxybenzoate (Ciba Specialty Chemicals)
*6: bis(2,2,6,6-tetramethyl-4-piperidyl) sebacate (Sankyo Co.)
*7: bis (1,2,2,6,6-pentamethyl-4-piperidyl) sebacate (Ciba Specialty Chemicals)
*8: 2-hydroxy-2-methyl-1-phenylpropan-1-one (Ciba Specialty Chemicals)
*9: 2,4,6-trimethylbenzoyldiphenylphosphine oxide (BASF)
*10: 1-hydroxycyclohexyl phenyl ketone (Ciba Specialty Chemicals)
*11: 2-hydroxy-2-methyl-1-phenylpropan-1-one: bis(2,6-dimethoxybenzoyl)-2,4,4-trimethylpentylphosphine oxide = 3:1 mixture (Ciba Specialty Chemicals)

Curing Process for Each Sample

Samples 1–15 and comparative samples 1–15 were coated onto aluminum plates (150×70 mm) with a bar coater to a film thickness of about 50 μm. The coatings of samples 1–15 and comparative samples 1–15 were then subjected to photocuring in air with a metal halide lamp (UVL-6000M2-N1, input power 120 W/cm, Ushio Inc.). The metal halide lamps was incorporated in a belt conveyor-type light-irradiating apparatus (UVC-5033, product of Ushio Inc.), the distance between the metal halide lamp and the coatings was 25 cm, the belt conveyor speed was 1.7 m/min, and the irradiation was performed twice. The photocured sample 1 was prepared as Example 1, the photocured sample 2 was prepared as Example 2, and so on. Also, the photocured comparative sample 1 was prepared as Comparative Example 1, the photocured comparative sample 2 was prepared as Comparative Example 2, and so on.

Evaluation of Coatings

The coated plates of Examples 1–15 and Comparative Examples 1–15 were allowed to stand at room temperature and darkness for 3 days. The state (color phase) of color reversion of the coatings was determined visually. They were also compared against a standard color chart according to "JIS Z 8721 (identification method by color-order system)", and the colors of the coatings were evaluated by selecting the chart color (expressed as HV/C) nearest to the color of the coating. The results are shown in Table 4 (Examples) and Table 5 (Comparative Examples).

These results demonstrated the effective function of the cationic dye color reversion-preventing agents.

TABLE 4

Colors of photocured samples

| | Type of sample used | Visually determined state of coating color reversion (color) | Color of coating (HV/C) |
|---|---|---|---|
| Example 1 | sample 1 | white | N9 |
| Example 2 | sample 2 | white | N9 |
| Example 3 | sample 3 | slightly pink | 5RP 9/0.5 |
| Example 4 | sample 4 | slightly pink | 5RP 9/0.5 |
| Example 5 | sample 5 | white | N9 |
| Example 6 | sample 6 | white | N9 |
| Example 7 | sample 7 | white | N9 |
| Example 8 | sample 8 | white | N9 |
| Example 9 | sample 9 | white | N9 |
| Example 10 | sample 10 | white | N9 |
| Example 11 | sample 11 | white | N9 |
| Example 12 | sample 12 | white | N9 |
| Example 13 | sample 13 | white | N9 |
| Example 14 | sample 14 | white | N9 |
| Example 15 | sample 15 | white | N9 |

TABLE 5

Colors of photocured samples (comparative examples)

| | Type of comparative sample used | Visually determined state of coating color reversion (color) | Color of coating (HV/C) |
|---|---|---|---|
| Comp. Ex. 1 | comparative sample 1 | light pink | 7.5P9/2 |
| Comp. Ex. 2 | comparative sample 2 | light pink | 10P9/1 |
| Comp. Ex. 3 | comparative sample 3 | light pink | 7.5P9/2 |
| Comp. Ex. 4 | comparative sample 4 | light pink | 10P9/2 |
| Comp. Ex. 5 | comparative sample 5 | light pink | 10P9/2 |
| Comp. Ex. 6 | comparative sample 6 | light blue | 5PB9/1 |
| Comp. Ex. 7 | comparative sample 7 | light blue | 5PB9/1 |
| Comp. Ex. 8 | comparative sample 8 | light blue | 5PB9/1 |
| Comp. Ex. 9 | comparative sample 9 | light blue | 5PB9/2 |
| Comp. Ex. 10 | comparative sample 10 | light blue | 5PB9/1 |
| Comp. Ex. 11 | comparative sample 11 | light blue | 5PB9/2 |
| Comp. Ex. 12 | comparative sample 12 | light blue | 5PB9/2 |
| Comp. Ex. 13 | comparative sample 13 | light blue | 5PB9/1 |
| Comp. Ex. 14 | comparative sample 14 | light blue | 5PB9/1 |
| Comp. Ex. 15 | comparative sample 15 | light pink | 10P9/2 |

The photocurable composition and color reversion-preventing method according to the invention allows effective prevention of color reversion in cured products obtained using light radical polymerization initiators comprising cationic dyes with maximum absorption in the visible light range of 400–740 nm and quaternary organo borates. Thus, the photocurable compositions and color reversion-preventing method can be applied to various uses such as paints and inks, which are dependent on the colors of cured products.

What is claimed is:

1. A photocurable color reversion preventing composition which comprises one or more phosphorous compounds; a compound with an ethylenic unsaturated bond; a cationic dye represented by general formula (1); and a quaternary organo borate represented by general formula (2);

$$D^+ \cdot A^- \quad (1)$$

where $D^+$ is a cation of a cationic dye with maximum absorption in the visible light range of 400–740 nm, which cationic dye is selected from the group consisting of methine-, polymethine-, xanthene-, azine-, oxazine-, thiazine-, diarylmethane- and triarylmethane-based cationic dyes and $A^-$ represents any anion;

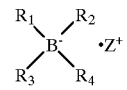

(2)

where $R_1$, $R_2$, $R_3$ and $R_4$ each independently represent an alkyl group, an aryl group, an aralkyl group, an alkenyl group, an alkynyl group, a silyl group, a heterocyclic group or a halogen atom; and $Z^+$ represents a quaternary ammonium cation, quaternary pyridinium cation, quaternary quinolinium cation, phosphonium cation, sulfonium cation, oxosulfonium cation, iodonium cation or metal cation and wherein the quaternary organo borate represented by general formula (2) is present in an amount of substantially excess molar ratio with respect to the cationic dye represented by general formula (1).

2. A composition according to claim 1 which further comprises an ultraviolet radical polymerization initiator.

3. A composition according to claim 1, which comprises said one or more phosphorous compounds in an amount of 0.05–15 parts by weight to 100 parts by weight of the compound with an ethylenic unsaturated bond.

4. A photocurable composition according to claim 1, wherein the phosphorous compound is a compound represented by general formula (4)

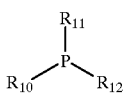
(4)

where $R_{10}$, $R_{11}$ and $R_{12}$ each independently represent an alkyl group, an alkoxy group, an aryl group, or an aryloxy group.

5. A method for preventing color reversion in photocured compositions, which method comprises adding one or more phosphorous compounds to a photocurable material containing a compound with an ethylenic unsaturated bond, a cationic dye represented by general formula (1), and a quaternary organo borate represented by general formula (2);

$$D^+ \cdot A^- \quad (1)$$

where $D^+$ is a cation of a cationic dye with maximum absorption in the visible light range of 400–740 nm, which cationic dye is selected from the group consisting of methine-, polymethine-, xanthene-, azine-, oxazine-, thiazine-, diarylmethane- and triarylmethane-based cationic dyes and $A^-$ represents any anion;

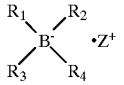
(2)

where $R_1$, $R_2$, $R_3$ and $R_4$ each independently represent an alkyl group, an aryl group, an aralkyl group, an alkenyl group, an alkynyl group, a silyl group, a heterocyclic group or a halogen atom; and $Z^+$ represents a quaternary ammonium cation, quaternary pyridinium cation, quaternary quinolinium cation, phosphonium cation, sulfonium cation, oxosulfonium cation, iodonium cation or metal cation and wherein the quaternary organo borate represented by general formula (2) is present in an amount of substantially excess molar ratio with respect to the cationic dye represented by general formula (1).

6. The method according to claim 5, wherein the photocurable material further comprises an ultraviolet radical polymerization initiator.

7. The method according to claim 5, wherein said one or more phosphorous compounds is added in an amount of 0.05–15 parts by weight to 100 parts by weight of the compound with an ethylenic unsaturated bond.

8. The method according to claim 5, wherein the phosphorous compound is represented by general formula (4)

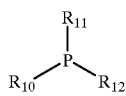
(4)

where $R_{10}$, $R_{11}$ and $R_{12}$ each independently represent an alkyl group, an alkoxy group, an aryl group, or an aryloxy group.

* * * * *